United States Patent [19]
Gonfaus et al.

[11] Patent Number: 5,896,308
[45] Date of Patent: Apr. 20, 1999

[54] COMBINATIONAL LOGIC CIRCUIT

[75] Inventors: Christine Gonfaus, Echirolles; Jacky Lebrun, Grenoble, both of France

[73] Assignee: SGS-Thomson Microelectronics S.A., Saint Genis, France

[21] Appl. No.: 08/653,957

[22] Filed: May 22, 1996

[30] Foreign Application Priority Data

May 24, 1995 [FR] France ................... 95 06406

[51] Int. Cl.$^6$ ........................................ G06F 7/50
[52] U.S. Cl. ........................ 364/787.03; 364/784.04; 364/787.01
[58] Field of Search ................. 364/760.2, 784.02, 364/784.04, 786.02, 786.04, 787.01, 787.04

[56] References Cited

U.S. PATENT DOCUMENTS

| | | | |
|---|---|---|---|
| 4,575,812 | 3/1986 | Kloker et al. | 364/760.03 |
| 4,601,007 | 7/1986 | Uva et al. | 364/784.03 |
| 4,651,296 | 3/1987 | Koike | 364/784.03 |
| 4,901,270 | 2/1990 | Galbi et al. | 364/786.03 |
| 5,043,934 | 8/1991 | Lamb | 364/787.04 |
| 5,128,892 | 7/1992 | Ullrich | 364/786.02 |
| 5,500,813 | 3/1996 | Song et al. | 364/787.03 |

FOREIGN PATENT DOCUMENTS

A-38 40 948  6/1990  Germany .............. H03K 19/00

OTHER PUBLICATIONS

French Search Report from French Patent Application Number 95 06406, filed May 24, 1995.

IBM Technical Disclosure Bulletin, vol. 30 No. 7, Dec. 1987, Armonk, NY, US pp. 132–133, "High Speed and High Density Full Adder".

Primary Examiner—Emmanuel L. Moise
Attorney, Agent, or Firm—Wolf, Greenfield & Sacks, P.C.

[57] ABSTRACT

The present invention relates to a combinational logic circuit including at least a pair of inputs and an output line; at least a first module and a symmetrical module; the first module including a parallel cell and a series cell; the parallel cell including two switches controlled by the pair of inputs and in parallel between a supply terminal and an output terminal coupled with the output line; the series cell including two switches controlled by the pair of inputs and in series between the supply and the output line; the symmetrical module including two cells symmetrical to the cells of the first module, with respect to the output line, coupled with a second supply and controlled in phase opposition.

22 Claims, 5 Drawing Sheets

(X*.Y*)

(X*+Y*)

(X.Y)*

(X+Y)*

COMBINATIONAL LOGIC CIRCUIT

BACKGROUND OF THE INVENTION

1. Field of the Invention

The present invention relates to the construction of combinational logic circuits, and more particularly to lookahead adder circuits.

2. Discussion of the Related Art

Conventional combinational circuits, and particularly adders, are constructed with logic gates. These logic gates are often connected in a cascade arrangement, which increases calculating time, since the output of each gate is valid only when the outputs of its preceding gates are valid.

Generally, to construct an adder, elementary adders are connected in a cascade arrangement, where a carry input of each elementary adder is connected to a carry output of its preceding elementary adder. The carry calculating time is a critical parameter since the result of a cascade adder, including its carry output, is valid only when the preceding adder supplies it with a valid carry input.

The fastest adders, such as TTL circuits '83 and '283 (4-bit adders), perform an anticipated carry calculation (lookahead). In these adders, the carry output is calculated independently from the bit-to-bit additions, the circuit directly combining the inputs. Thus, the carry calculation is performed at essentially the same time as the bit-to-bit additions.

The calculating time for the carry is determined by the longest path traveled by the signals from the inputs to the carry output. This path includes logic gates arranged in a number of logic layers, one logic layer including elementary logic gates having their inputs supplied by the outputs of elementary gates from the preceding layer. Each logic layer brings in the propagation delay of an elementary gate. Adders '83 or '283 include four logic layers for the carry output. Their entire circuit is a complex circuit including 232 transistors.

The 8-bit or 16-bit adders are generally constructed with 4-bit adders connected in a cascade arrangement, since it is more advantageous than making an 8-bit or 16-bit lookahead circuit.

SUMMARY OF THE INVENTION

An object of the present invention is to reduce the calculating time for a combinational logic circuit, and specifically for a lookahead adder.

Another object of the present invention is to reduce the number of transistors required to achieve a logic function.

These objects are achieved by constructing a logic circuit from an assembly of two-transistor cells, instead of logic gates.

More specifically, an embodiment of the present invention is directed to a method for constructing a combinational logic circuit supplying a specific commutative combination of at least two inputs on at least one output line, including the following steps:

- establishing a first expression (f(A*,B*)) of the combination including only terms corresponding to AND and OR functions of the inverted values of the inputs;
- establishing a second expression (g(A,B)) of the inverse of said combination including only terms corresponding to AND and OR functions of the non-inverted values of said inputs;
- providing, between a first supply voltage (VDD) and the output line (C*), a first network corresponding to the first expression (f(A*,B*)), including:
  - for each AND term, a pair of switches connected in series (0a, 1a), and
  - for each OR term, a pair of switches connected in parallel (0b, 1b); and
- providing, between a second supply voltage (GND) and the output line (C*), a second network corresponding to the second expression (g(A,B)), including:
  - for each AND term, a pair of switches connected in series (0c, 1c),
  - for each OR term, a pair of switches connected in parallel (0d, 1d), the switches of one pair being controlled by both inputs, and the switches of the first network being controlled in phase opposition with respect to the switches of the second network.

According to an embodiment of the present invention, the switches of the first and second network are of complementary types and are controlled in phase.

According to an embodiment of the present invention, the control means compare the rectified supply voltage to two reference voltages.

According to an embodiment of the present invention, this method includes the step of replacing a group of cells in series between two terminals by a switch connected between the two terminals and preceded by an inverter having its input connected to a first supply line by a direct group of cells and to a second supply line by a complementary group of cells; the direct group being identical to the group of replaced cells; the complementary group including, for each parallel cell of the direct group, a series cell, and conversely; the cells of the complementary group being connected together in series if the cells of the direct group are connected in parallel, and conversely.

According to an embodiment of the present invention, the combination is a logic addition.

According to an embodiment of the present invention, the combination is a logic adder lookahead function having at least two times n inputs (n>1).

According to an embodiment of the present invention, the logic combinational circuit includes a logic adder having a carry input.

Another embodiment of the present invention is directed to a combinational logic circuit including at least a pair of inputs and an output line, including at least a first module and a symmetrical module; the first module including a parallel cell and a series cell; the parallel cell including two switches controlled by the pair of inputs and in parallel between a supply terminal coupled with a first supply voltage and an output terminal coupled with the output line; the series cell including two controlled switches controlled by the pair of inputs and in series between the supply terminal and the output line; the symmetrical module including two cells symmetrical to the cells of the first module with respect to the output line, coupled with a second supply voltage and controlled in phase opposition.

According to an embodiment of the present invention, the combinational logic circuit includes n pairs of inputs (n different from zero), n modules and their symmetricals, the pairs of switches of each module being controlled by a pair of inputs, the supply terminal of the parallel cell of each module of rank k (k from 1 to n−1) being connected to the output terminal of the cell of the module of rank k+1.

According to an embodiment of the present invention, the combinational logic circuit includes another pair of inputs, the output terminal of the parallel cell of the module of rank 1 being connected to the output line by two switches in parallel respectively controlled by the inputs of the other pair of inputs, the output terminal of the symmetrical cell of the module of rank 1 being connected to the output line by two switches in series, respectively controlled by the inputs of the other pair of inputs.

According to an embodiment of the present invention, the combinational logic circuit includes an additional input and two additional switches controlled by the additional input in phase opposition, the output terminal of the parallel cell of the module of rank 1 being connected to the output line by one of the two additional switches, the output terminal of the parallel cell of the symmetrical module of rank 1 being connected to the output line by the other additional switch.

These objects, features and advantages, as well as others, of the present invention will be discussed in detail in the following description of specific embodiments, taken in conjunction with the following drawings, but not limited by them.

DETAILED DESCRIPTION

Figure 1A:
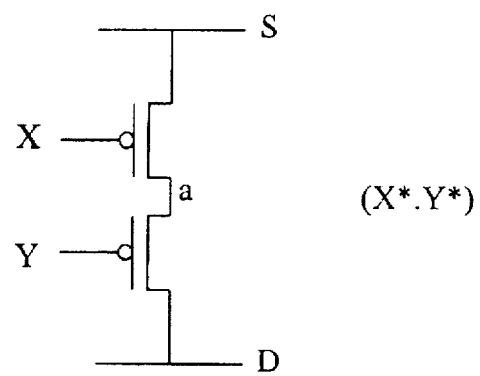
FIGS. 1A to 1D show four two-transistor cells used according to an embodiment of the invention.

To reduce the calculating time of a combinational logic circuit, and also to reduce its number of transistors, an embodiment of the present invention is directed to a method for constructing the circuit from two-transistor cells, the configuration of which is determined by an analysis of the logic function of the circuit.

The method according to the embodiment of the invention applies to combinational circuits which include at least two inputs which can be inverted without changing the result of the logic function. In mathematical terms, it applies to logic circuits performing commutative operations. Such a case occurs, for example, for an adder.

The embodiment of the invention is based on the use of four types of cells. Each cell includes two complementary MOS transistors, operating as switches which, according to their conducting or blocked state, establish a coupling between a supply voltage and an output line. Each cell includes two control terminals corresponding to the gates of the MOS transistors and two main terminals which will be called source terminal S and drain terminal D.

As it will appear from the following description, the cells can be connected in series between a supply voltage and a common output line, a drain terminal D of a cell being connected to a source terminal S of another cell. The cells can also be connected in parallel, two source terminals S of two cells being connected together and coupled to a supply voltage (here, "coupled" means connected, with other cells possibly interposed), two drain terminals D being connected together and coupled to the output line.

Among the four types of cells, two types of cells are dedicated to setting to 1, two others to setting to 0. The cells for setting to 1 are to be arranged in a network included between the output line and a first supply voltage with a logic level of 1 (from now on called "supply VDD"). The cells for setting to 0 are to be arranged in a network included between the output line and a second supply voltage with a logic level of 0 (from now on called "ground").

To describe the method according to the embodiment of the invention, it is convenient to associate a logic function to each cell, as if it were a logic gate supplying a logic state 0 or 1. However, the cells operate as switches having their output terminals, here called drain terminals D, connected to a supply voltage or disconnected.

In the case of the cells for setting to 1, the output state is 1 or x, where x indicates the state in which the drain terminal D is disconnected. The x state of the cells for setting to 1 can be assimilated to logic state 0, assuming that cells for setting to 0 connect the output line to the ground each time the cells for setting to 1 supply the x state.

In the case of the cells for setting to 0, the output state is 0 or x. The x state of the cells for setting to 0 can be assimilated to logic state 1, assuming that cells for setting to 1 connect the output line to supply VDD each time the cells for setting to 0 supply the x state.

In a circuit, the cells for setting to 1 will be controlled so as to be unable to supply logic state 1 at the time when the cells for setting to 0 supply logic state 0.

FIGS. 1A to 1D show the four types of cells used according to an embodiment of the invention. Each cell performs a single logic operation and includes two MOS transistors, the gates of which receive inputs X and Y.

FIG. 1A shows a first cell, called series cell for setting to 1, including two P-channel MOS transistors in series between a drain terminal D and a source terminal S to be coupled with supply VDD. The state of drain terminal D according to the states of inputs X and Y is given by:

TABLE I

| X | Y | D |
|---|---|---|
| 0 | 0 | 1 |
| 0 | 1 | x |
| 1 | 0 | x |
| 1 | 1 | x |

The logic function performed thus is $D=X^*.Y^*$ (i.e., $X^*$ AND $Y^*$), if the x state is assimilated to state 0. In the present application, the symbol * is used to refer to an inverse.

Figure 1B:
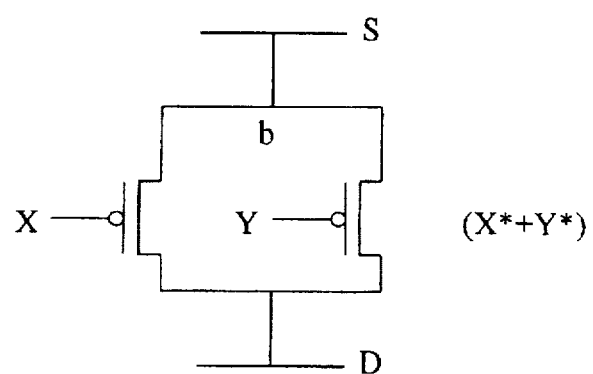

FIG. 1B shows a second cell, called parallel cell for setting to 1, including two P-channel MOS transistors in parallel between a drain terminal D and a source terminal S to be coupled to supply VDD. The state of drain terminal D according to the states of inputs X and Y is given by:

TABLE II

| X | Y | D |
|---|---|---|
| 0 | 0 | 1 |
| 0 | 1 | 1 |
| 1 | 0 | 1 |
| 1 | 1 | x |

The logic function performed thus is $D=X^*+Y^*$ (i.e., $X^*$ OR $Y^*$), if the x state is assimilated to state 0.

Figure 1C:
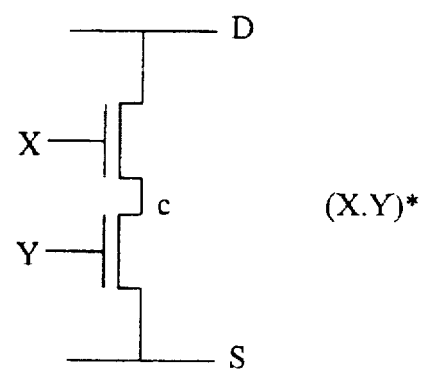

FIG. 1C shows a third cell, called series cell for setting to 0, including two N-channel MOS transistors in series between a drain terminal D and a source terminal S to be coupled to the ground. The state of drain terminal D according to the states of inputs X and Y is given by:

TABLE III

| X | Y | D |
|---|---|---|
| 0 | 0 | x |
| 0 | 1 | x |
| 1 | 0 | x |
| 1 | 1 | 0 |

The logic function performed thus is $D=(X.Y)^*$, if the x state is now assimilated to state 1.

Figure 1D:
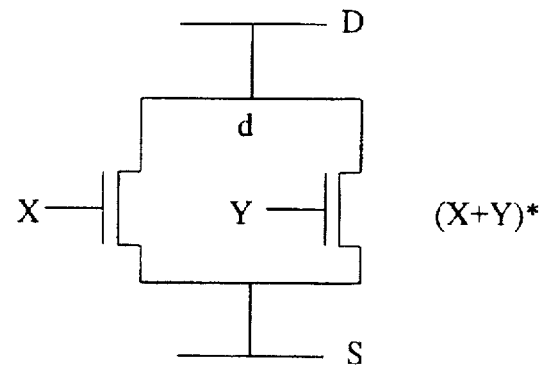

FIG. 1D shows a fourth cell, called parallel cell for setting to 0, including two N-channel MOS transistors in parallel between a drain terminal D and a source terminal S to be coupled to the ground. The state of drain terminal D according to the states of inputs X and Y is given by:

TABLE IV

| X | Y | D |
|---|---|---|
| 0 | 0 | x |
| 0 | 1 | 0 |
| 1 | 0 | 0 |
| 1 | 1 | 0 |

The logic function performed thus is $D=(X+Y)^*$, if the x state is assimilated to state 1.

Thus, the first two cells only supply logic levels of 1 and the last two cells only supply logic levels of 0.

An embodiment of the present invention provides for the construction of a combinational circuit having an association of parallel and series cells corresponding to a determined logic combination.

Generally, the series association of two cells (or of two groups of cells) between a supply voltage and an output line corresponds to an AND logic operation between the respective logic functions performed by the two cells (or the two groups of cells).

If the inputs of the cells for setting to 1 are at logic state 0, the cells are conducting. The output line then is at logic state 1. The cells for setting to 1 are thus active on the inverses of the inputs. The output state corresponds to an elementary logic operation performed on the inverse of each input state (although there is no real inversion of the inputs). Consequently, the logic functions performed by the cells for setting to 1 have been expressed as $(X^*.Y^*)$ and $(X^*+Y^*)$.

If the inputs of the cells for setting to 0 are at logic state 1, the cells are conducting and the output line is at logic state 0. Thus, the cells for setting to 0 are active on the non-inverted states of the inputs, but the inverted state is the output state. Consequently, the logic functions performed by the cells for setting to 0 have been expressed as $(X.Y)^*$ and $(X+Y)^*$ while they are identical to the logic functions of the cells for setting to 1.

The logic function performed by a combinational circuit using the four types of cells can be determined in the following way.

The series association of transistors, cells or groups of cells corresponds to logic operation AND between the logic functions associated with these transistors, cells or groups of cells.

The parallel association of transistors, cells or groups of cells corresponds to logic operation OR between the logic functions associated with these transistors, cells or groups of cells.

A network for setting to 1, that is, only including transistors and cells for setting to 1, corresponds to a logic function performing all the AND type or OR type logic operations, these operations being performed on the inputs of the switches or cells, but each input being artificially replaced in the expression of the logic function by its inverse. The logic function of the network for setting to 1 is thus written as:

$$f(X^*,Y^*,Z^*, \ldots),$$

function f including all the logic operations which correspond to connecting the transistors or cells for setting to 1 in parallel and/or in series.

A network for setting to 0, that is, only including transistors and cells for setting to 0, corresponds to a logic function performing all the AND type and OR type logic operations, these operations being performed on the inputs of the transistors or cells, where the inputs are not replaced by their inverses, but where the entire logic function is artificially inverted. The logic function of the network for setting to 0 is thus written as:

$$g^*(X,Y,Z, \ldots),$$

function g including all the logic operations corresponding to connecting the transistors or cells for setting to 0 in parallel and/or in series.

To function, a combinational circuit includes at least one network for setting to 1 and at least one network for setting to 0 controlled by the same inputs, the logic functions of which are equal, although expressed differently, that is:

$$f(X^*,Y^*,Z^*, \ldots )=g^*(X,Y,Z, \ldots )$$

Conversely, to find a logic combinational circuit with a predetermined function by means of the method of an embodiment of the invention, a first expression f and a second expression g are established, which are two expressions of the predetermined function, likely to be directly transposed to the above-mentioned cells.

Generally, expressions f and g are not identical. Accordingly, the networks for setting to 0 and for setting to 1 are different. However, in specific cases which will be illustrated by the following examples, these expressions are identical. Therefore, the networks for setting to 0 and for setting to 1 are identical as well. The invention then leads to particularly simple structures.

In order to simplify the discussion of the method according to an embodiment of the invention, a method will be discussed in relation with the construction of specific logic circuits.

EXAMPLE 1

2-Bit Two-Number Adder Lookahead Circuit

The addition of two 2-bit numbers A and B will be considered, the bits of A and B being respectively referred to as A0, A1, and B0, B1, the low weight bits being A0 and B0. The result is a number S having 2 bits of sum S0, S1 and 1 carry bit C2. A carry input C0 is provided to connect an adder of the lookahead circuit in a cascade arrangement with another adder.

The general factorized equation of the 2-bit lookahead circuit can be expressed as:

$$C2=(A1.B1)+(A1+B1).[(A0.B0)+(A0+B0).C0] \quad (1)$$

or $$C2^*=[(A1.B1)+(A1+B1).[(A0.B0)+(A0+B0).C0]]^* \quad (2)$$

The expression of C2* directly corresponds to the desired form of an expression g. Indeed:

$$C2^* = g^*(A1, B1, A0, B0, C0)$$

In order to establish the corresponding expression f, C2* must be expressed as a function of the inverted inputs, that is, A1*, B1*, A0*, B0*, C0*. It can be shown that, in this particular case, expression f is obtained by inverting all variables in equation (1) without modifying its expression. Thus:

$$g(A1, B1, A0, B0, C0) = (A1.B1) + (A1+B1).[(A0.B0) + (A0+B0).C0] \quad (3)$$

$$f(A1^*, B1^*, A0^*, B0^*, C0^*) = (A1^*.B1^*) + (A1^*+B1^*).[(A0^*.B0^*) + (A0^*+B0^*).C0^*] \quad (4)$$

Expressions f and g are identical, except that they apply to mutually inverted variables. The lookahead circuit will thus comprise a network for setting to 1 and a network for setting to 0 which will be symmetrical with respect to an output line C2*.

Expression g includes elementary terms in which only one logic operation of the type (X.Y) or (X+Y) is performed. Thus, a network of parallel and series cells for setting to 0 can be made to correspond to expression g. A series cell will correspond to a term of the type (X.Y) and a parallel cell will correspond to a term of the type (X+Y). The cells are connected together in parallel or in series according to whether the corresponding elementary terms of g are respectively associated by a (+) or (.) operator.

Figure 2:
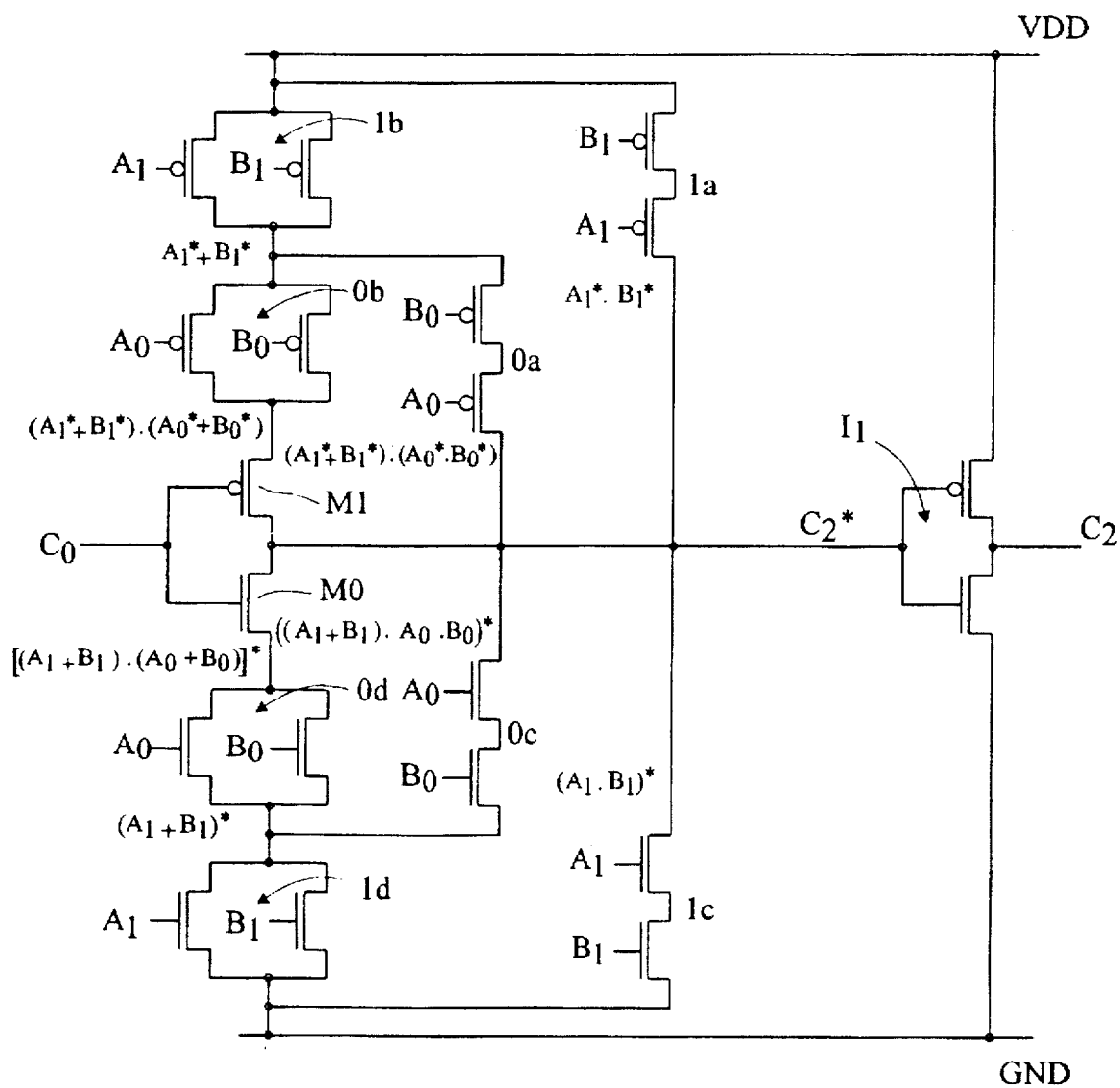
FIG. 2 shows a lookahead circuit of a 2-bit adder according to an embodiment of the invention.

FIG. 2 shows a lookahead circuit for a 2-bit adder, having the previously mentioned function. It includes a network for setting to 1 connected between supply VDD and output line C2* and a network for setting to 0 connected between output line C2* and the ground.

The network for setting to 0 corresponding to the expression g expressed by equation (3) includes the following elements:

- an N-channel MOS transistor M0 having its gate controlled by C0 and its drain connected to output line C2*,
- a first parallel cell for setting to 0 (0d), controlled by A0 and B0, the drain terminal being connected to the source terminal of transistor M0,
- a first series cell for setting to 0 (0c), controlled by A0 and B0, the drain terminal being connected to output line C2*, the source terminal being connected to the source terminal of the first parallel cell 0d,
- a second parallel cell for setting to 0 (1d), controlled by A1 and B1, the drain terminal being connected to the source terminal of cells 0d and 0c, and
- a second series cell for setting to 0 (1c), controlled by A1 and B1, the drain terminal being connected to output line C2*, the source terminal being connected to the source terminal of the second parallel cell 1d and to the ground.

The network for setting to 1 corresponding to the expression f expressed by equation (4) includes, symmetrically to the network for setting to 0, the following elements:

- a P-channel MOS transistor M1 having its gate controlled by C0 and its drain connected to output line C2*,
- a first parallel cell for setting to 1 (0b), controlled by A0 and B0, the drain terminal being connected to the source terminal of transistor M1,
- a first series cell for setting to 1 (0a), controlled by A0 and B0, the drain terminal being connected to output line C2*, the source terminal being connected to the source terminal of the first parallel cell 0b,
- a second parallel cell for setting to 1 (1b), controlled by A1 and B1, the drain terminal being connected to the source terminal of cells 0b, 0a, and
- a second series cell for setting to 1 (1a), controlled by A1 and B1, the drain terminal being connected to output line C2*, the source terminal being connected to the source terminal of the second parallel cell 1b and to supply VDD.

The combinational lookahead circuit of FIG. 2 further includes an inverter I1 to supply level C2 from output line C2*.

EXAMPLE 2

N-Bit Two-Number Adder Lookahead Circuit n-bit adder lookahead circuits with a carry input (C0) can be constructed by generalizing the above-mentioned functions and by constructing the corresponding circuits. Thus, the logic carry calculation function for an n-bit adder is given by equation (1'):

$$C_{n+1} = (An.Bn) + (An+Bn).[\ldots[(A0.B0) + (A0+B0).C0]] \quad (1')$$

Expressions f and g, which are identical again, are deducted from this equation:

$$g(An, Bn, \ldots, A0, B0, C0) = (An.Bn) + (An+Bn).[\ldots[(A0.B0) + (A0+B0).C0]] \quad (3')$$

$$f(An^*, Bn^*, \ldots, A0^*, B0^*, C0^*) = (An^*.Bn^*) + (An^*+Bn^*).[\ldots[(A0^*.B0^*) + (A0^*+B0^*).C0^*]] \quad (4')$$

Based on equations (3') and (4'), an n-bit lookahead circuit is obtained iteratively, from an (n−1)-bit lookahead circuit, by adding the following cells:

- a parallel cell for setting to 0, controlled by An and Bn, between the parallel cell for setting to 0 controlled by An-1, Bn-1 and the ground,
- a series cell for setting to 0, controlled by An and Bn, between the output line and the ground,
- symmetrically, a parallel cell for setting to 1, controlled by An and Bn, between the parallel cell for setting to 1 controlled by An-1, Bn-1 and supply VDD, and
- symmetrically, a series cell for setting to 1, controlled by An and Bn, between the output line and supply VDD.

EXAMPLE 3

4-Bit Two-Number Adder Lookahead Circuit

Figure 3:
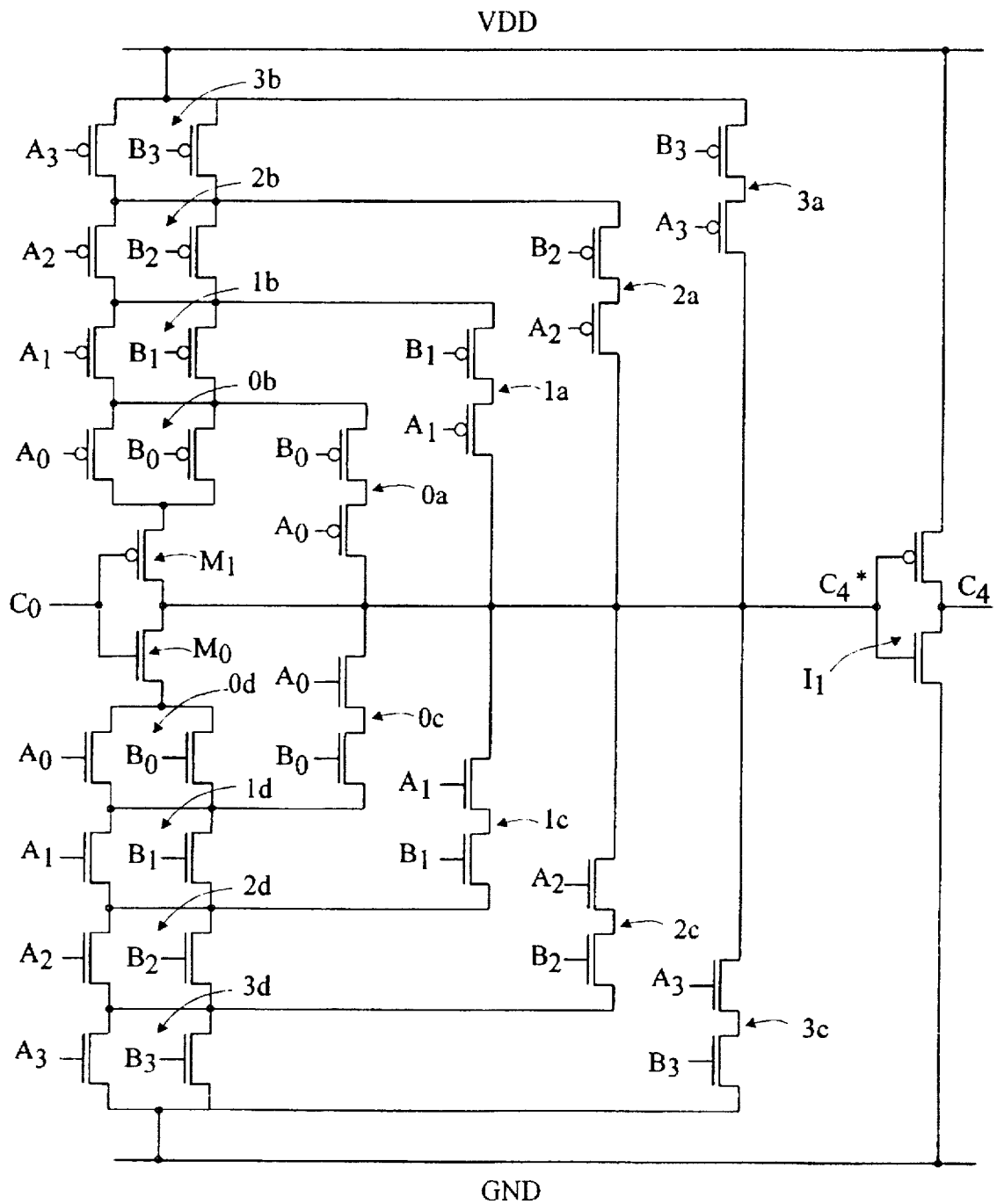
FIG. 3 shows a lookahead circuit of a 4-bit adder according to an embodiment of the invention.

FIG. 3 thus shows a combinational 4-bit adder lookahead circuit, obtained from the combinational lookahead circuit of the 2-bit adder of FIG. 2. A module of rank 2, including a parallel cell 2d and a series cell 2c controlled by A2 and B2, and a module of rank 3 including a parallel cell 3d and a series cell 3c, controlled by A3 and B3, have been added to the network for setting to 0. Symmetrically, in the network for setting to 1, two modules (2b, 2a; 3b, 3a), each one including a parallel cell and a series cell for setting to 1, respectively controlled by A2, B2 and by A3, B3, have been added. The output line, now called C4*, is connected to output terminal C4 by inverter I1.

By comparing FIGS. 2 and 3, it should be noted that, according to a major advantage of the embodiment of the present invention, when passing from a 2-bit adder to a 4-bit adder (and more generally to an n-bit adder), the number of logic layers does not increase and thus the calculating time of the circuit does not significantly change if the same value of the total setting to 1 (setting to 0) resistance is maintained thanks to an adequate dimensioning of the transistors.

Adder Without a Carry Input

For an adder without a carry input (C0), the lookahead circuit is simplified. For a 2-bit adder:

$$C2^* = g^*(A1,B1,A0,B0) = [(A1.B1) + [(A1+B1).(A0.B0)]]^* \quad (5)$$

$$C2^* = f(A1^*,B1^*,A0^*,B0^*) = [(A1^*.B1^*) + [(A1^*+B1^*).(A0^*.B0^*)]] \quad (6)$$

The combinational circuit corresponds, for example, to the 2-bit adder lookahead circuit with a carry input C0 of FIG. 2, eliminating cells 0d and 0a and transistors M0 and M1 (M1 being replaced by a short-circuit). It should be noted that there no longer is an identity between expressions f and g and that the circuit is not symmetrical.

Generally, an n-bit adder lookahead circuit without a carry input will be obtained from an n-bit adder lookahead circuit with a carry input by following the previous steps.

It should be noted that the logic function of the n-bit adder lookahead without a carry input can correspond to several circuits which are variants of the circuit previously indicated and which can be obtained by the method according to an embodiment of the invention. Thus, a 2-bit adder lookahead circuit without a carry input, equivalent to the lookahead circuit corresponding to equations (5) and (6), but having a different network for setting to 0 which corresponds to the following g function, will easily be found:

$$C2^* = g^*(A1,B1,A0,B0) = [(A1+B1).[(A1.B1) + (A0.B0)]]^* \quad (5')$$

Reduction of the Number of Series Transistors

FIG. 3 illustrates a lookahead circuit in which each network includes, in series between a supply voltage and an output line, four parallel cells (0b, 1b, 2b, 3b; 0d, 1d, 2d, 3d) and a MOS transistor (M1; M0). Thus, there are five transistors in series and the impedance becomes high, at the cost of the switching speed.

To maintain the circuit's rapid calculating time, an embodiment of the present invention provides for the separation of a group of series cells from the network and its replacement by a MOS transistor inserted in place of the group of cells. This MOS transistor is then controlled by an equivalent of the group of cells separated from the network including, as will appear hereafter, a "direct" group identical to the separated group and a "complementary" group.

This alternative circuit will be described in relation with the 2-bit combinational lookahead circuit of FIG. 2. It should however be clear that it is of little interest in that case, but that it will be able to cumulatively apply to an adder with a greater number of bits such as the adder of FIG. 3. The number of series transistors is thus reduced. The creation of an additional layer (whatever the number of bits of the adder) does not come across in the critical carry transfer path, from C0 to Cn.

Figure 4A:
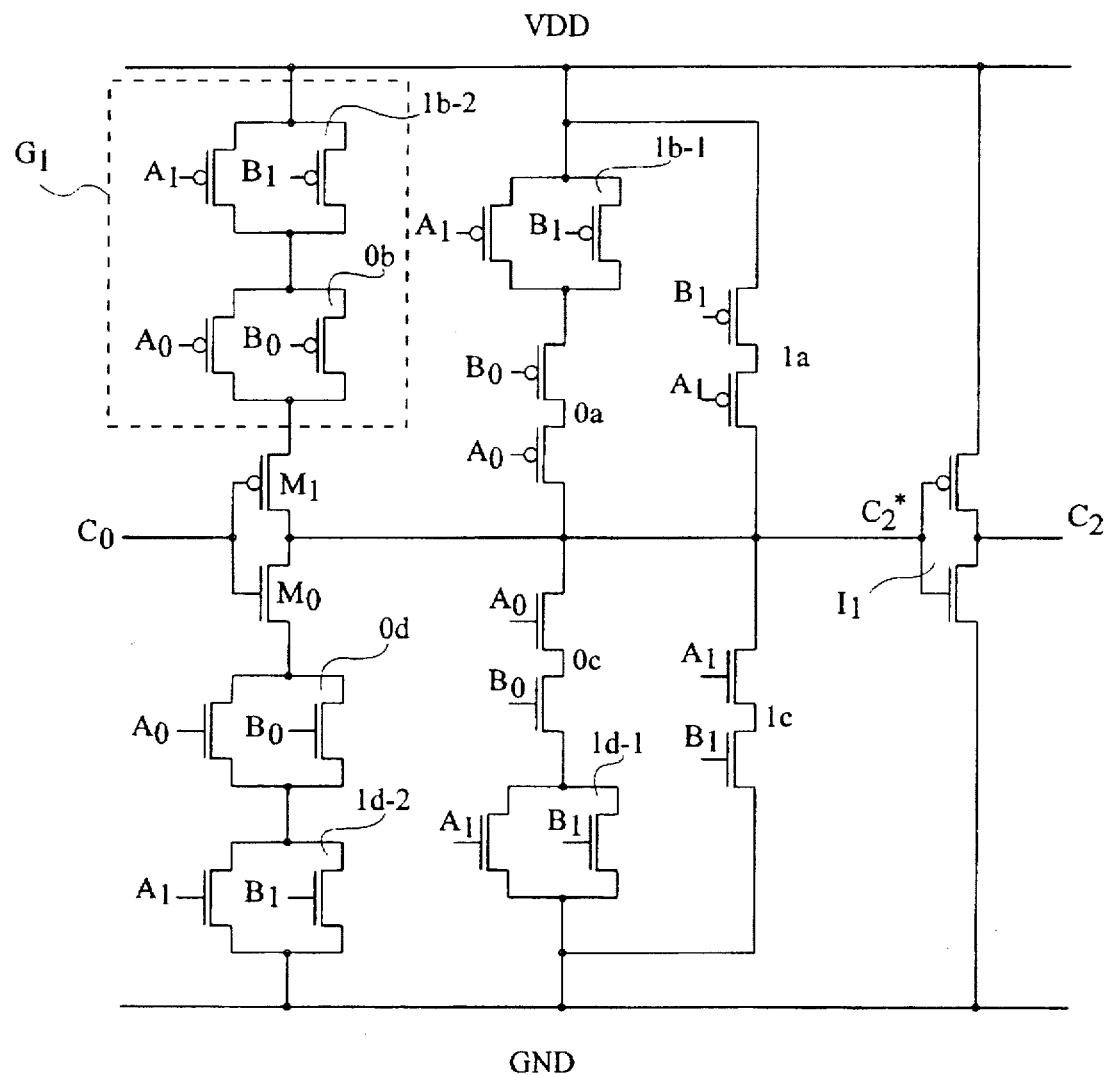
FIGS. 4A and 4B illustrate an alternative embodiment of the circuit shown in FIG. 2.

A structure, as shown in FIG. 4A, has the same function as the structure of FIG. 2 but based on an alternative writing of equations (3) and (4). These equations (3) and (4) were:

$$g(A1,B1,A0,B0,C0) = (A1.B1) + (A1+B1).[(A0.B0) + (A0+B0).C0] \quad (3)$$

$$f(A1^*,B1^*,A0^*,B0^*,C0^*) = (A1^*.B1^*) + (A1^*+B1^*).[(A0^*.B0^*) + (A0^*+B0^*).C0^*] \quad (4)$$

and can be rewritten by developing their second term:

$$g(A1,B1,A0,B0,C0) = (A1.B1) + (A1+B1).(A0.B0) + (A1+B1).(A0+B0).C0 \quad (7)$$

$$f(A1^*,B1^*,A0^*,B0^*,C0^*) = (A1^*.B1^*) + (A1^*+B1^*).(A0^*.B0^*) + (A1^*+B1^*).(A0^*+B0^*).C0^* \quad (8)$$

Expression f translates into three groups of parallel cells:

- the first group includes cell 1a and corresponds to the operation (A1*.B1*);
- the second group includes cells 0a and 1b-1 in series and corresponds to the operation (A1*+B1*).(A0*.B0*); and
- the third group includes cells 0b and 1b-2 in series with transistor M1 and corresponds to the operation (A1*+B1*).(A0*+B0*).C0*.

Figure 4B:
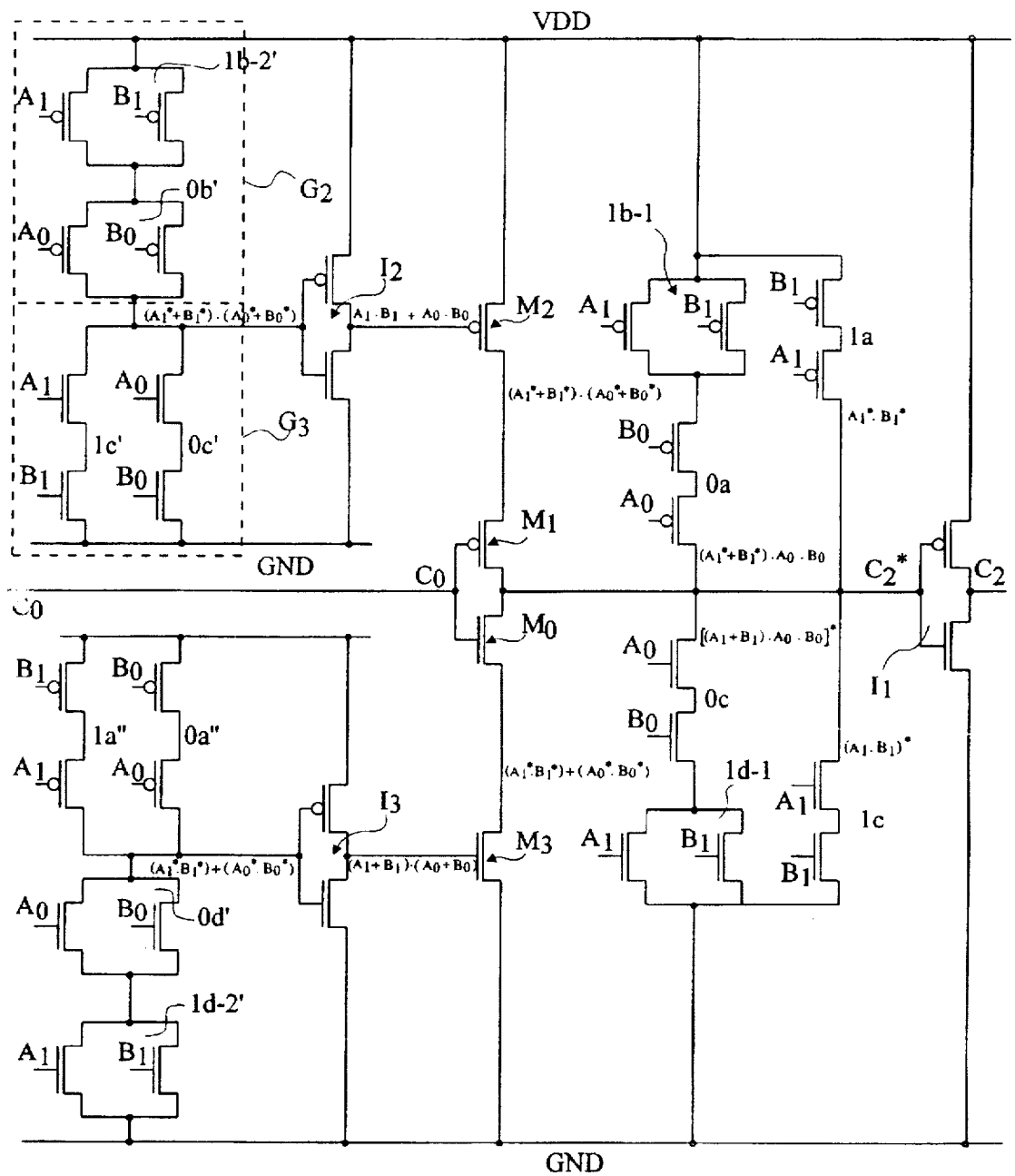

This third group, and more specifically block G1 for setting to 1, including cells 0b and 1b-2 in series, is modified in the alternative circuit illustrated in FIG. 4B, as well as the symmetrical group of the network for setting to 0.

Block G1 is replaced by a P-channel MOS transistor M2 controlled by an inverter I2 having its control terminal connected, on one side, to supply VDD by a "direct" block G2 and, on the other side, to the ground by a "complementary" block G3.

The "direct" block or group includes cells 0b' and 1b-2' and is identical to the separated block G1. It has the following logic function:

$$f(A1^*,B1^*,A0^*,B0^*) = (A1^*+B1^*).(A0^*+B0^*) \quad (9)$$

The "complementary" block or group is obtained by expressing the same function as:

$$g^*(A1,B1,A0,B0) = [(A1.B1) + (A0.B0)]^* \quad (10)$$

Thus, the "complementary" group of cells includes two series cells for setting to 0, 0c' and 1c', connected in parallel between the ground and the control line of inverter I2.

In FIG. 4B, the network for setting to 0 modified symmetrically to the network for setting to 1 has also been illustrated.

It should be noted that replacing a group of cells connected in series by a MOS transistor controlled by this group also is advantageous, since the group of cells then has a high capacity at the cost of the switching speed.

Although the invention has been more particularly described in conjunction with lookahead circuits which have the advantage of having symmetrical structures, it has many other applications, some of which will lead as advantageously to symmetrical structures. This case will appear each time the exclusive-OR function is used. The present invention has many other alterations and modifications which will appear to those skilled in the art.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A method for constructing a combinational logic circuit that provides on at least one output line a specific commutative combination of at least two pairs of inputs, the method comprising the steps of:

establishing a first expression of the specific commutative combination including only terms corresponding to AND and OR functions of inverted values of the inputs;

establishing a second expression of an inverse of the specific commutative combination including only terms corresponding to AND and OR functions of non-inverted values of the at least two inputs;

providing, coupled between a first supply voltage and the at least one output line, a first network corresponding to the first expression, including:

for each AND term of the first expression, a first pair of switches connected in series; and for each OR term of the first expression, a second pair of switches connected in parallel; and providing, coupled between a second supply voltage and the at least one output line, a second network corresponding to the second expression, including:

for each AND term of the second expression, a third pair of switches connected in series; and for each OR term of the second expression, a fourth pair of switches connected in parallel;

each pair of switches being controlled by one of the pairs of inputs, and the first and second pairs of switches being controlled to operate in phase opposition with respect to the third and fourth pairs of switches; and wherein the first and second pairs of switches are of a first type;

the third and fourth switches are of a second type that is complementary to the first type; and the at least two pairs of inputs are in phase.

2. The method of claim 1, wherein each pair of switches forms a cell, and wherein at least one of the steps of providing includes the steps of:

selecting a portion of one of the first network and the second network, the portion having a group of cells between two terminals; and forming, in place of the selected portion having the group of cells between the two terminals, a switch connected between the two terminals, an inverter that precedes the switch, a direct group of cells interconnected between an input of the inverter and a first supply line, and a complementary group of cells interconnected between the input of the inverter and a second supply line; wherein the direct group is identical to the selected plurality of cells; wherein the complementary group includes, for each cell of the direct group formed by a pair of switches connected in parallel, a cell formed by a pair of switches connected in series, and for each cell of the direct group formed by a pair of switches connected in series, a cell formed by a pair of switches connected in parallel; wherein the cells of the complementary group respectively correspond to the cells of the direct group; and wherein the switches of each cell of the complementary group are connected together in series if the switches of the corresponding cell of the direct group are connected in parallel, and the switches of each cell of the complementary group are connected together in parallel if the switches of the corresponding cell of the direct group are connected in series.

3. The method of claim 1, wherein the specific commutative combination is a logic addition.

4. The method of claim 1, wherein the logic circuit provides a lookahead function for the specific commutative combination which is a logic addition, the logic circuit having at least two times n inputs, n being greater than the integer 1.

5. The method of claim 4, wherein the logic circuit includes a carry input.

6. A combinational logic circuit, comprising:

at least n pairs of inputs, n being an integer greater than one;

an output line;

at least n first modules, each including a supply terminal coupled to a first supply voltage, a first output terminal coupled to the output line, a second output terminal coupled to the output line, a first parallel cell, and a first series cell, the first parallel cell including two switches controlled by one pair of inputs and disposed in parallel between the supply and the first output terminal of the module; the first series cell including two switches controlled by one pair of inputs and disposed in series between the supply and the second output terminal of the module; and at least n second modules, each including a supply terminal coupled to a second supply voltage, a first output terminal coupled to the output line, a second output terminal coupled to the output line, a second parallel cell, and a second series cell, the second parallel cell including two switches controlled by one pair of inputs and disposed in parallel between the supply and the first output terminal of the module; the second series cell including two switches controlled by one pair of inputs and disposed in series between the supply and the second output terminal of the module;

wherein the cells of the at least n first modules are complementary and symmetrical to the cells of the at least n second modules with respect to the output line, and wherein the first modules and the second modules are controlled in phase; and wherein each of the n first modules has a corresponding rank of 1 to n;

the supply terminal of a first module having a rank k is connected to the first output terminal of a first module having a rank k+1;

each of the n second modules has a corresponding rank of 1 to n; and the supply terminal of a second module having a rank k is connected to the first output terminal of a second module having a rank k+1.

7. The combinational logic circuit of claim 6, further comprising:

another pair of inputs, wherein an output terminal of a parallel cell of the module of rank 1 is connected to the output line by two switches in parallel respectively controlled by the another pair of inputs, an output terminal of a parallel cell symmetrical to the parallel cell of the module of rank 1 being connected to the output line by two switches in series, respectively controlled by the another pair of inputs.

8. The combinational logic circuit of claim 7, wherein the two switches in parallel respectively controlled by the another pair of inputs is a parallel cell of a module of rank 0, and wherein the combinational logic circuit further comprises:

an additional input;

a first additional switch; and a second additional switch complementary to the first additional switch, the first and second additional switches being controlled by the additional input in phase opposition, an output terminal of the parallel cell of the module of rank 0 being connected to the output line by the first additional switch, an output terminal of a parallel cell symmetrical to the parallel cell of the module of rank 0 being connected to the output line by the second additional switch.

9. A combinational logic circuit, comprising:

at least two first inputs, each to receive a respective signal;

at least two second inputs, each to receive a respective signal, each of the first inputs, with a corresponding one of the second inputs, forming a respective pair of first and second inputs;

an output line that provides an output signal;

a first supply terminal that receives a first supply voltage;

a second supply terminal that receives a second supply voltage;

a plurality of first cells coupled to the respective pairs of first and second inputs, the output line, and the first supply terminal, that electrically connects and electrically disconnects the output line to the first supply terminal in response to the respective signals;

a plurality of second cells coupled to the respective pairs of first and second inputs, the output line, and the second supply terminal, that electrically connects and electrically disconnects the output line to the second supply terminal in response to the respective signals; and wherein the plurality of first cells electrically disconnects the first supply terminal from the output line when the second supply terminal is electrically connected to the output line, and wherein the plurality of second cells electrically disconnects the second supply terminal from the output line when the first supply terminal is electrically connected to the output line.

10. The circuit of claim 9, wherein the output signal is a logic calculation represented by a first expression and a second expression, each expression including at least one of an AND function and an OR function of one of the plurality of input pairs; wherein, for each AND function of the first expression, one of the plurality of first cells includes a first pair of switches connected in series; wherein, for each OR function of the first expression, one of the plurality of first cells includes a second pair of switches connected in parallel; wherein, for each AND function of the second expression, one of the plurality of second cells includes a third pair of switches connected in series; wherein, for each OR function of the second expression, one of the plurality of second cells includes a fourth pair of switches connected in parallel; and wherein each pair of switches has a pair of control terminals coupled to one of the respective pairs of first and second inputs.

11. The circuit of claim 10, wherein each of the respective signals is a digital signal, and wherein each switch of the first, second, third and fourth pairs of switches is a transistor having a gate that receives one of the plurality of bits of the respective signals.

12. The circuit of claim 9, wherein the circuit is an adder lookahead circuit, and wherein the plurality of first cells and the plurality second cells provide to the output line as the output signal, a carry bit of a sum of a first number defined by the respective signals received by the first inputs and a second number defined by the respective signals received by the second inputs.

13. The circuit of claim 9, wherein the circuit is an adder lookahead circuit, and wherein the circuit further comprises:

a carry input coupled to the plurality of first cells, the plurality of second cells, and the output line, the plurality of first cells and the plurality second cells providing, as the output signal to the output line, a carry bit in response to a carry input signal received on the carry input and a sum of a first number defined by the respective signals received by the first inputs and a second number defined by the respective signals received by the second inputs.

14. A combinational logic circuit, comprising:

at least two first inputs, each to receive a respective signal;

at least two second inputs, each to receive a respective signal, each of the first inputs, with a corresponding one of the second inputs, forming a respective pair of first and second inputs;

an output line that provides an output signal;

a first supply terminal that receives a first supply voltage;

a second supply terminal that receives a second supply voltage; and connecting means coupled to the pair of inputs, for electrically connecting and electrically disconnecting the output line to the first supply terminal in response to the first signal and the second signal, and for electrically connecting and electrically disconnecting the output line to the second supply terminal in response to the first signal and the second signal, the first supply terminal being electrically disconnected from the output line when the second supply terminal is electrically connected to the output line, and the second supply terminal being electrically disconnected from the output line when the first supply terminal is electrically connected to the output line.

15. The circuit of claim 14, wherein the output signal is a logic calculation represented by a first expression and a second expression, each expression including at least one of an AND function and an OR function of one of the plurality of input pairs; wherein, for each AND function of the first expression, the connecting means includes a first pair of switches connected in series; wherein, for each OR function of the first expression, the connecting means includes a second pair of switches connected in parallel; wherein, for each AND function of the second expression, the connecting means includes a third pair of switches connected in series; wherein, for each OR function of the second expression, the connecting means includes a fourth pair of switches connected in parallel; and wherein each pair of switches has a pair of control terminals coupled to the at least one pair of first and second inputs.

16. The circuit of claim 15, wherein the circuit is an adder lookahead circuit, and wherein the AND cells and the OR cells of the connecting means provide to the output line as the output signal, a carry bit of a sum of a first number defined by the respective signals received by the first inputs and a second number defined by the respective signals received by the second inputs.

17. The circuit of claim 15, wherein the circuit is an adder lookahead circuit, and wherein the circuit further comprises:

a carry input coupled to the connecting means, to receive a carry input signal, the connecting means providing, as the output signal, a carry bit in response to a carry input signal received on the carry input and a sum of a first number defined by the respective signals received by the first inputs and a second number defined by the respective signals received by the second inputs.

18. A method for performing a logic calculation, the method comprising the steps of:

reducing the logic calculation to a first expression and a second expression, each expression including at least one of an AND function of a first signal and a second signal, and an OR function of the first signal and the second signal;

forming a plurality of first cells corresponding to the first expression, that electrically connects and electrically disconnects an output line to a first supply terminal in response to the first signal and the second signal; and forming a plurality of second cells corresponding to the second expression, that electrically connects and electrically disconnects the output line to a second supply terminal in response to the first signal and the second signal, such that the first supply terminal is electrically disconnected from the output line when the second supply terminal is electrically connected to the output line, and the second supply terminal is electrically disconnected from the output line when the first supply terminal is electrically connected to the output line.

19. The method of claim 18, wherein the steps of forming the plurality of first cells includes a step of:

providing, for each AND function of the first expression, a cell of the plurality of first cells including a pair of switches connected in parallel between the output line and the first supply terminal, and for each OR function of the first expression, a cell of the plurality of first cells including a pair of switches connected in series between the output line and the first supply terminal; and wherein the step of forming the plurality of second cells includes a step of:

providing, for each AND function of the second expression, a cell of the plurality of second cells including a pair of switches connected in parallel between the output line and the second supply terminal, and for each OR function of the second expression, a cell of the plurality of second cells including a pair of switches connected in series between the output line and the second supply terminal.

20. The method of claim 19, wherein the steps of providing the plurality of first cells and the plurality of second cells form an adder lookahead circuit that provides a carry bit of a sum of a first number defined by the first signal and a second number defined by the second signal.

21. The method of claim 19, further comprising a step of:

providing a carry input coupled to plurality of first cells and the plurality of second cells, to receive a carry input signal, so that the output line provides a carry bit in response to the carry input signal and a sum of a first number defined by the first signal and a second number defined by the second signal.

22. A method for constructing a combinational logic circuit that provides on at least one output line a specific commutative combination of at least two inputs, the method comprising the steps of:

establishing a first expression of the specific commutative combination including only terms corresponding to AND and OR functions of inverted values of the at least two inputs;

establishing a second expression of an inverse of the specific commutative combination including only terms corresponding to AND and OR functions of non-inverted values of the at least two inputs;

providing, coupled between a first supply voltage and the at least one output line, a first network corresponding to the first expression, including:

for each AND term of the first expression, a first pair of switches connected in series; and for each OR term of the first expression, a second pair of switches connected in parallel; and providing, coupled between a second supply voltage and the at least one output line, a second network corresponding to the second expression, including:

for each AND term of the second expression, a third pair of switches connected in series; and for each OR term of the second expression, a fourth pair of switches connected in parallel;

each pair of switches being controlled by the at least two inputs, and the first and second pairs of switches being controlled in phase opposition with respect to the third and fourth pairs of switches; and wherein each pair of switches forms a cell, and at least one of the steps of providing includes the steps of:

selecting a portion of one of the first network and the second network, the portion having a group of cells between two terminals; and forming, in place of the selected portion having the group of cells between the two terminals, a switch connected between the two terminals, an inverter that precedes the switch, a direct group of cells interconnected between an input of the inverter and a first supply line, and a complementary group of cells interconnected between the input of the inverter and a second supply line; wherein the direct group is identical to the selected plurality of cells; wherein the complementary group includes, for each cell of the direct group formed by a pair of switches connected in parallel, a cell formed by a pair of switches connected in series, and for each cell of the direct group formed by a pair of switches connected in series, a cell formed by a pair of switches connected in parallel; wherein the cells of the complementary group respectively correspond to the cells of the direct group; and wherein the switches of each cell of the complementary group are connected together in series if the switches of the corresponding cell of the direct group are connected in parallel, and the switches of each cell of the complementary group are connected together in parallel if the switches of the corresponding cell of the direct group are connected in series.

* * * * *

UNITED STATES PATENT AND TRADEMARK OFFICE
CERTIFICATE OF CORRECTION

PATENT NO. : 5,896,308

DATED : April 20, 1999

INVENTOR(S): Christine Gonfaus and Jacky Lebrun

It is certified that error appears in the above-identified patent and that said Letters Patent is hereby corrected as shown below:

In col. 7, line 14, should read:
$$f(A1^*,B1^*,C0^*)=(A1^*.\ B1^*).[(A0^*.B0^*)+$$

In col. 9, line 10, should read:
$$C2^*=g^*(A1,B1,A0,B0)=[(A1.\ B1)+[(A1+B1).(A0.B0)]]^*$$

In col. 9, line 33, should read:
$$C2^*=g^*(A1,B1,A0,B0)=[(A1+\ B1).[(A1.B1)+(A0.B0)]]^*$$

Signed and Sealed this

Thirty-first Day of August, 1999

Attest:

Q. TODD DICKINSON

*Attesting Officer*     *Acting Commissioner of Patents and Trademarks*